(12) United States Patent
Kuo

(10) Patent No.: US 10,886,260 B2
(45) Date of Patent: Jan. 5, 2021

(54) DISPLAY DEVICE

(71) Applicant: InnoLux Corporation, Miao-Li County (TW)

(72) Inventor: Shu-Ming Kuo, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/537,730

(22) Filed: Aug. 12, 2019

(65) Prior Publication Data

US 2020/0083198 A1 Mar. 12, 2020

Related U.S. Application Data

(60) Provisional application No. 62/728,118, filed on Sep. 7, 2018.

(30) Foreign Application Priority Data

Feb. 25, 2019 (CN) .......................... 2019 1 0137463

(51) Int. Cl.
*H01L 25/075* (2006.01)
*H01L 25/16* (2006.01)
(Continued)

(52) U.S. Cl.
CPC ........ *H01L 25/0753* (2013.01); *H01L 25/167* (2013.01); *H01L 33/24* (2013.01);
(Continued)

(58) Field of Classification Search
CPC ... H01L 33/486; H01L 33/502; H01L 33/505; H01L 33/507; H01L 33/54; H01L 33/56;
(Continued)

(56) References Cited

U.S. PATENT DOCUMENTS

2005/0084775 A1* 4/2005 Kawaguchi ............ G02B 5/201
430/7
2012/0134134 A1* 5/2012 Bechtel ............... H01L 25/0753
362/84

(Continued)

FOREIGN PATENT DOCUMENTS

CN 106684108 A 5/2017

OTHER PUBLICATIONS

Extended European Search Report dated Jan. 24, 2020, issued in application No. EP 19193876.0.
(Continued)

*Primary Examiner* — Zandra V Smith
*Assistant Examiner* — Andre C Stevenson
(74) *Attorney, Agent, or Firm* — McClure, Qualey & Rodack, LLP

(57) ABSTRACT

A display device is provided, which includes a first substrate, a first subpixel and a second subpixel. The first subpixel is disposed on the first substrate and the second subpixel is disposed adjacent to the first subpixel. The first subpixel and the second subpixel are spaced apart from each other by a pitch. At least one of the first subpixel and the second subpixel includes a light-emitting unit and a light conversion layer disposed on the light-emitting unit. The first subpixel includes an active layer having a first length along a direction that is perpendicular to a normal direction of the first substrate. The light conversion layer has a second length along the direction that is perpendicular to the normal direction of the first substrate. The first length (A), the second length (B) and the pitch ($S_p$) conform to the following formula: A+1 micrometers<B<$S_p$−1 micrometers.

20 Claims, 9 Drawing Sheets

(51) Int. Cl.
    *H01L 33/46*           (2010.01)
    *H01L 33/24*           (2010.01)
    *H01L 33/60*           (2010.01)
    *H01L 33/50*           (2010.01)

(52) U.S. Cl.
    CPC ............ *H01L 33/46* (2013.01); *H01L 33/508* (2013.01); *H01L 33/60* (2013.01)

(58) Field of Classification Search
    CPC ....... H01L 2933/0041; H01L 2933/005; H01L 2115/10; H01L 35/505; H01L 33/62; C09K 11/70; F21Y 2115/10
    See application file for complete search history.

(56)          References Cited

U.S. PATENT DOCUMENTS

| | | |
|---|---|---|
| 2015/0255505 A1 | 9/2015 | Jeoung et al. |
| 2018/0151543 A1 | 5/2018 | Lee |
| 2018/0182931 A1 | 6/2018 | Lee et al. |

OTHER PUBLICATIONS

Chinese language office action dated Jul. 3, 2020, issued in application No. CN 201910137463.5.

\* cited by examiner

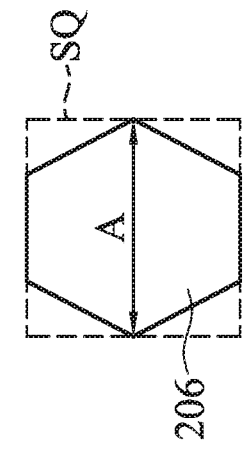
FIG. 5A
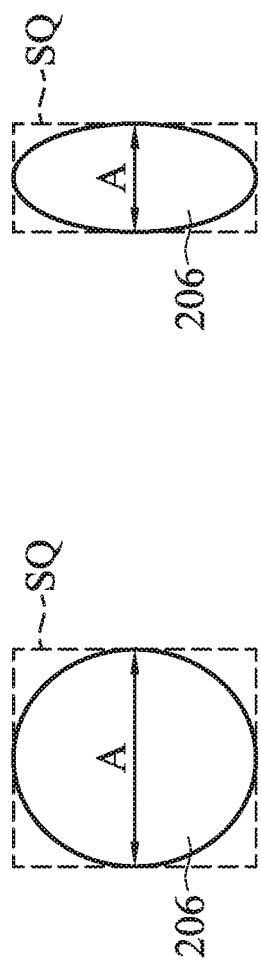
FIG. 5B
FIG. 5C
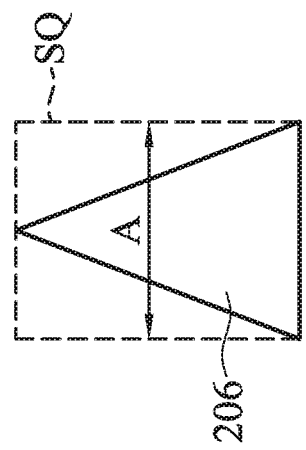
FIG. 5D
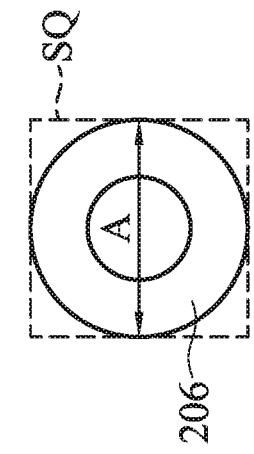
FIG. 5E

DISPLAY DEVICE

CROSS REFERENCE TO RELATED APPLICATIONS

This application claims priority of U.S. Provisional Patent Application No. 62/728,118, filed on Sep. 7, 2018, and Chinese Patent Application No. 201910137463.5, filed on Feb. 25, 2019, the entirety of which are incorporated by reference herein.

BACKGROUND

Technical Field

The present disclosure relates to a display device, and in particular relates to the configuration of the elements in the display device.

Description of the Related Art

Electronic products that come with a display panel, such as smartphones, tablets, notebooks, monitors, and TVs, have become indispensable necessities in modern society. With the flourishing development of such portable electronic products, consumers have high expectations regarding the quality, functionality, and price of such products.

In recent years, light-emitting diodes (LEDs) have been widely used. The light-emitting diodes have been thinned, miniaturized, and arrayed by the micro light-emitting diode (micro LED) technology. Although currently existing light-emitting diodes have been adequate for their intended purposes, they have not been entirely satisfactory in all respects. For example, the problems such as the improvement of light conversion efficiency or light extraction efficiency etc. still exist. Accordingly, the development of a structural design of the display device that is capable of further improving the performance of light-emitting diodes is still one of the goals that the industry currently aims for.

SUMMARY

In accordance with some embodiments of the present disclosure, a display device is provided. The display device includes a first substrate, a first subpixel and a second subpixel. The first subpixel is disposed on the first substrate and the second subpixel is disposed adjacent to the first subpixel. The first subpixel and the second subpixel are spaced apart from each other by a pitch. At least one of the first subpixel and the second subpixel includes a light-emitting unit and a light conversion layer disposed on the light-emitting unit. The first subpixel includes an active layer having a first length along a direction that is perpendicular to a normal direction of the first substrate. The light conversion layer has a second length along the direction that is perpendicular to the normal direction of the first substrate. The first length (denoted as A), the second length (denoted as B) and the pitch (denoted as $S_p$) conform to the following formula: $A+1$ micrometers$<B<S_p-1$ micrometers.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIGS. 5A-5E illustrate the top-view diagrams of the active layer of the light-emitting unit in accordance with some embodiments of the present disclosure.

DETAILED DESCRIPTION

Figure 1:
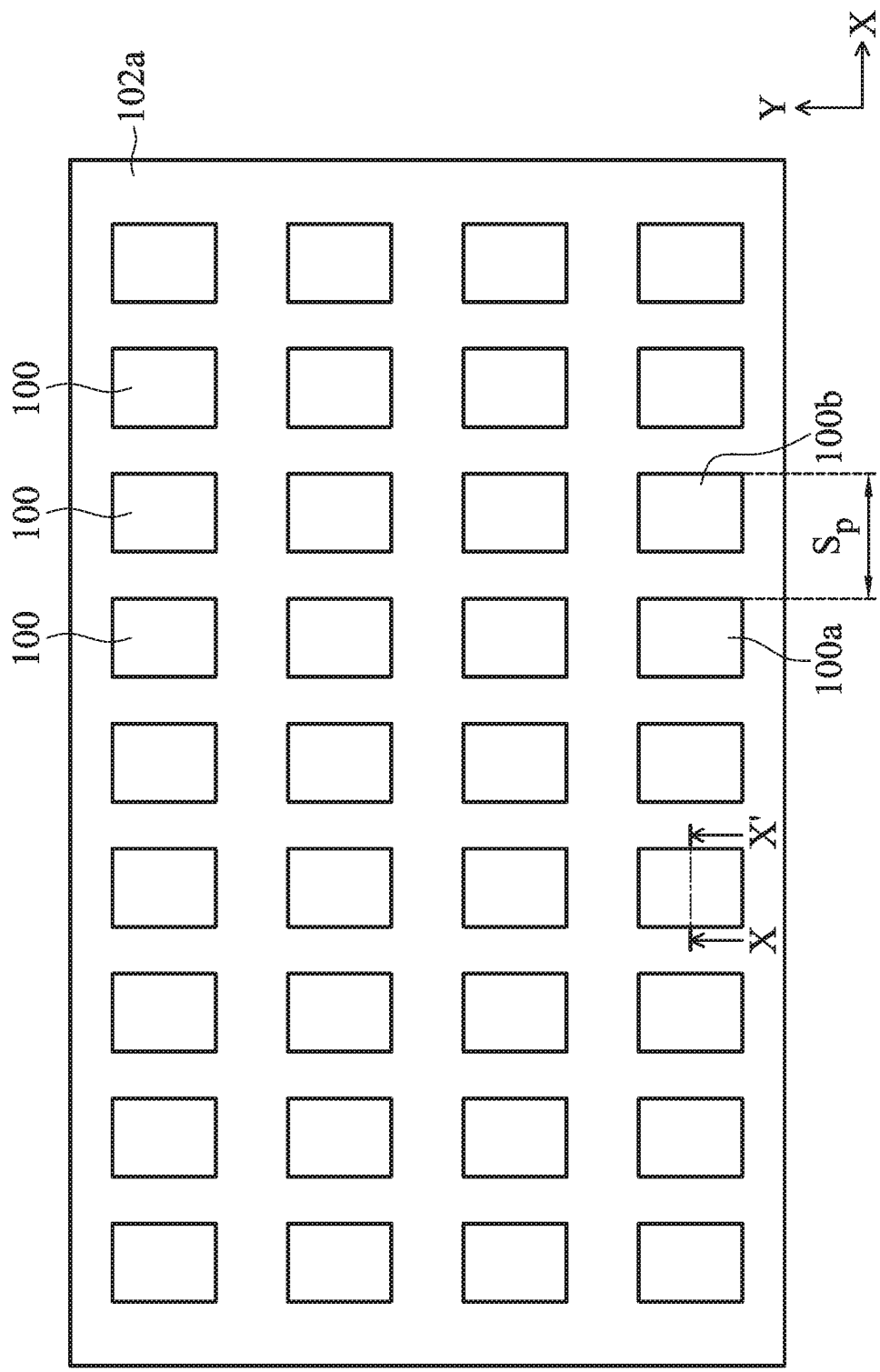
FIG. 1 illustrates a top-view diagram of the display device in accordance with some embodiments of the present disclosure.

The structure of the display device of the present disclosure and the manufacturing method thereof are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. In addition, in this specification, expressions such as "first material layer disposed on/over a second material layer", may indicate the direct contact of the first material layer and the second material layer, or it may indicate a non-contact state with one or more intermediate layers between the first material layer and the second material layer. In the above situation, the first material layer may not be in direct contact with the second material layer.

It should be noted that the elements or devices in the drawings of the present disclosure may be present in any form or configuration known to those with ordinary skill in the art. In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer, position or section. Thus, a first element, component, region, layer, portion or section discussed below could be termed a second element, component, region, layer, portion or section without departing from the teachings of the present disclosure.

It should be understood that the descriptions of the exemplary embodiments are intended to be read in connection with the accompanying drawings, which are to be considered part of the entire written description. The drawings are not drawn to scale. In addition, structures and devices are shown schematically in order to simplify the drawing.

The terms "about" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In addition, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Furthermore, the phrase "in a range between a first value and a second value" or "in a range from a first value to a second value" indicates that the range includes the first value, the second value, and other values between them.

In accordance with some embodiments of the present disclosure, a display device is provided. The display device includes a light-emitting unit and a light conversion layer that are configured in a specific manner so that light conversion efficiency or light-emitting efficiency of the display device may be improved.

FIG. 1 illustrates a top-view diagram of a display device 10 in accordance with some embodiments of the present disclosure. It should be understood that only some of the elements of the display device 10 are shown in FIG. 1 for clarity of illustration. In accordance with some embodiments of the present disclosure, additional features may be added to the display device 10 as described below. In some other embodiments, some of the features of the display device 10 described below may be replaced or omitted.

Referring to FIG. 1, the display device 10 may include a first substrate 102a and a plurality of subpixels 100 disposed on the first substrate 102a. For convenience of description, the two subpixels 100 are denoted as a first subpixel 100a and a second subpixel 100b herein, and the first subpixel 100a and the second subpixel 100b are taken as an example to illustrate the pitch of the subpixels 100. As shown in FIG. 1, the second subpixel 100b is disposed adjacent to the first subpixel 100a, and spaced apart from each other by a pitch $S_p$. In some embodiments, the display device 10 may be, for example, a flexible display device, a touch display device, a tiled display device, or a curved display device, but the present disclosure is not limited thereto.

It should be understood that the term "pitch" as used herein may be defined as the distance between the center point of a region of one subpixel and the center point of a region of another subpixel that is adjacent thereto. Alternatively, as shown in FIG. 1, the term "pitch" may be defined as the distance between an edge of one side (e.g., the right side) of a region of one subpixel (e.g., the first subpixel 100a) and an edge of the same side (e.g., the right side) of a region of another subpixel (e.g., the second subpixel 100b) that is adjacent thereto. Moreover, the first subpixel 100a and the second subpixel 100b may emit light of different or the same color. For example, the first subpixel 100a and the second subpixel 100b may emit red light, green light, blue light, or white light and so on, but the present disclosure is not limited thereto.

In some embodiments, the first substrate 102a may be an array substrate. For example, the first substrate 102a may serve as a driving substrate of the display device 10. Specifically, the first substrate 102a may include a driving circuit (not illustrated), and the driving circuit may include, for example, an active driving circuit or a passive driving circuit. In accordance with some embodiments, the driving circuit may include, but is not limited to, a transistor (e.g., a switching transistor or a driving transistor and so on), a data line, a scan line, a conductive pad, a dielectric layer, or other circuits and so on. The switching transistor may be used to control the lighting-on or turning-off of the subpixel 100. In some embodiments, the driving circuit may control the subpixel 100 by an external integrated circuit (IC) or microchip and so on.

In some embodiments, the material of the first substrate 102a may include, but is not limited to, glass, quartz, sapphire, polycarbonate (PC), polyimide (PI), polyethylene terephthalate (PET), rubbers, glass fibers, ceramics, another suitable material, or a combination thereof. In some embodiments, the first substrate 102a may include a metal-glass fiber composite plate, a metal-ceramic composite plate, or a printed circuit board and so on.

Figure 2:
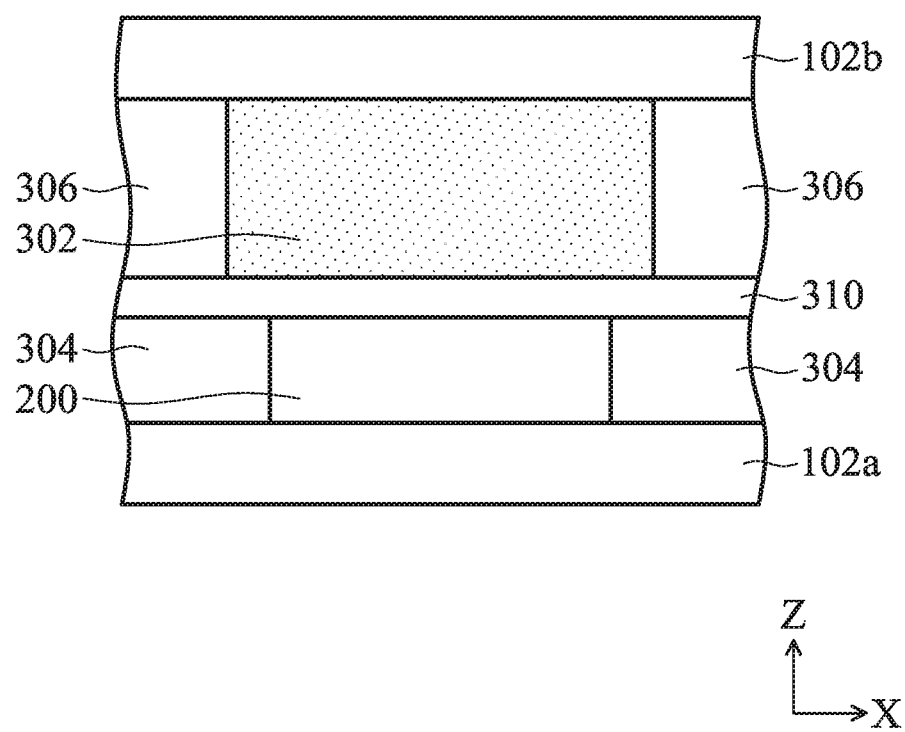
FIG. 2 illustrates a cross-sectional diagram of the subpixel along the line segment X-X' in FIG. 1 in accordance with some embodiments of the present disclosure.

Next, refer to FIG. 2, which illustrates a cross-sectional diagram of the subpixel 100 along the line segment X-X' in FIG. 1 in accordance with some embodiments of the present disclosure. It should be understood that only some of the elements of the subpixel 100 are shown in FIG. 2 to illustrate the positional relationship between the elements.

As shown in FIG. 2, the subpixel 100 may include a second substrate 102b that is disposed opposite to the first substrate 102a in accordance with some embodiments. In some embodiments, the material of the second substrate 102b may include, but is not limited to, glass, quartz, sapphire, polycarbonate (PC), polyimide (PI), polyethylene terephthalate (PET), rubbers, glass fibers, ceramics, other suitable materials, or a combination thereof.

In some other embodiments, a protective layer may be used to replace the second substrate 102b. In some embodiments, the protective layer may include an organic material or an inorganic material. The protective layer may be formed by a coating process. In some embodiments, the organic material may include, but is not limited to, an epoxy resin, an acrylic resin such as polymethylmetacrylate (PMMA), benzocyclobutene (BCB), polyimide, polyester, polydimethylsiloxane (PDMS), other suitable materials, or a combination thereof. In some embodiments, the inorganic material may include, but is not limited to, silicon nitride, silicon oxide, silicon oxynitride, aluminum oxide, other suitable materials, or a combination thereof.

In addition, the subpixel 100 may include a light-emitting unit 200 and a light conversion layer 302 that are disposed between the first substrate 102a and the second substrate 102b, and the light conversion layer 302 may be disposed on the light-emitting unit 200. In accordance with some embodiments, the light-emitting unit 200 may include a light-emitting diode (LED), a micro light-emitting diode, or a mini light-emitting diode, or an organic light-emitting diode (OLED), but the present disclosure is not limited thereto. In some other embodiments, the light-emitting unit 200 may include, but is not limited to, liquid crystals (LC), quantum dots (QD), a fluorescent material, a phosphor material, other suitable materials, or a combination thereof. In some embodiments, the light source provided by the light-emitting unit 200 may include light having short wavelength. For example, the wavelength may be in a range from about 10 nanometers (nm) to about 500 nanometers. In some embodiments, the light source provided by the light-emitting unit 200 may include blue light or UV light.

Figure 3A:
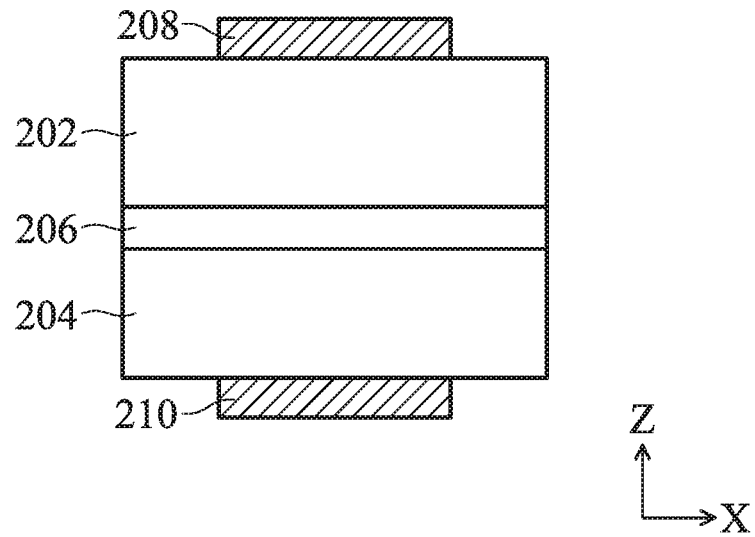
FIGS. 3A and 3B illustrate the cross-sectional diagrams of the light-emitting unit in accordance with some embodiments of the present disclosure.
Figure 3B:
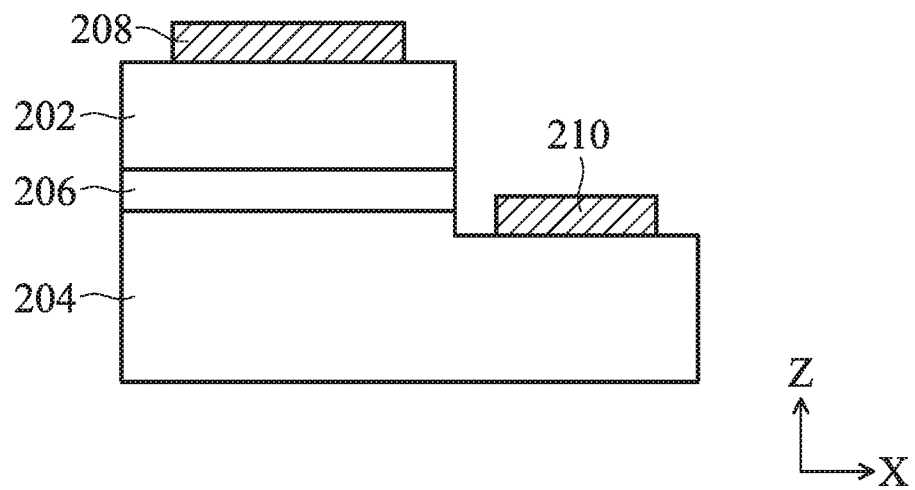

Refer to FIGS. 3A and 3B, which illustrate the cross-sectional diagrams of the light-emitting unit 200 in accordance with some embodiments of the present disclosure. As shown in FIG. 3A, in accordance with some embodiments, the light-emitting unit 200 may be a light-emitting unit having a vertical type structure. In accordance with some other embodiments, as shown in FIG. 3B, the light-emitting unit 200 may be a light-emitting unit having a flip-chip type structure.

Specifically, the light-emitting unit 200 may include a first semiconductor layer 202, a second semiconductor layer 204, and an active layer 206. The active layer 206 may be disposed between the first semiconductor layer 202 and the second semiconductor layer 204. In some embodiments, one of the first semiconductor layer 202 and the second semiconductor layer 204 may be used to provide and transport electrons, and the other may be used to provide and transport electron holes. In some embodiments, the first semiconductor layer 202 and the second semiconductor layer 204 may be formed of a semiconductor material having a n-type conductivity and a semiconductor material having a p-type conductivity, respectively. However, in some other embodiments, the first semiconductor layer 202 and the second semiconductor layer 204 may be formed of a semiconductor material having a p-type conductivity and a semiconductor material having a n-type conductivity, respectively.

In some embodiments, the semiconductor material having a n-type conductivity may include, but is not limited to, gallium nitride (n-GaN) or aluminum indium phosphide (n-AlInP), which are doped with tetravalent atoms. In addition, the semiconductor material having a p-type conductivity may include, but is not limited to, gallium nitride (p-GaN) or aluminum indium phosphide (p-AlInP), which are doped with divalent atoms. Moreover, in some embodiments, the active layer 206 may have a quantum well structure. For example, the active layer 206 may include a single quantum well (SQW), a multiple quantum well (MQW), a nanowire, other suitable structures, or a combination thereof. In some embodiments, the material of the active layer 206 may include, but is not limited to, gallium nitride, aluminum indium phosphide (AlInP), indium gallium nitride (InGaN), or a combination thereof.

In some embodiments, the first semiconductor layer 202, the second semiconductor layer 204, and the active layer 206 may be formed by an epitaxial growth process. The epitaxial growth process may include, but is not limited to, a molecular beam epitaxy (MBE) process, a liquid phase epitaxy (LPE) process, a solid phase epitaxy (SPE) process, a vapor phase epitaxy (VPE) process, a selective epitaxial growth (SEG) process, a metal organic chemical vapor deposition (MOCVD) process, an atomic layer deposition (ALD) process or a combination thereof.

In addition, in some embodiments, the light-emitting unit 200 may also include a first electrode layer 208 and a second electrode layer 210 that are disposed on the first semiconductor layer 202 and the second semiconductor layer 204. Specifically, in the embodiments where the light-emitting unit 200 has a vertical type structure, the first electrode layer 208 and the second electrode layer 210 are disposed on opposite sides (as shown in FIG. 3A). In the embodiments where the light-emitting unit 200 has a flip-chip type structure, the first electrode layer 208 and the second electrode layer 210 are disposed on the same side (as shown in FIG. 3B).

In some embodiments, the first electrode layer 208 and the second electrode layer 210 may be further electrically connected to the signal line (not illustrated) and the driving circuit (not illustrated) of the display device 10. In some embodiments, the material of the first electrode layer 208 and the second electrode layer 210 may include a conductive metal material. For example, the conductive metal material may include, but is not limited to, copper (Cu), aluminum (Al), tungsten (W), titanium (Ti), gold (Au), platinum (Pt), nickel (Ni), tin (Sn), indium (In), copper alloy, aluminum alloy, tungsten alloy, titanium alloy, gold alloy, platinum alloy, nickel alloy, tin alloy, indium alloy, other suitable conductive materials, or a combination thereof.

In some embodiments, the first electrode layer 208 and the second electrode layer 210 may be formed by one or more deposition processes, photolithography processes, and etching processes. In some embodiments, the deposition process may include a chemical vapor deposition process, a physical vapor deposition process, an electroplating process, an electroless plating process, other suitable processes, or a combination thereof. In addition, in some embodiments, the photolithography process may include photoresist coating (e.g., spin coating), soft baking, hard baking, mask aligning, exposure, post-exposure baking, developing the photoresist, rinsing, drying, or another suitable process. In some embodiments, the etching process may include a dry etching process, a wet etching process, or another suitable etching process.

It should be understood that, in accordance with some embodiments, the structure of the light-emitting unit 200 may be adjusted or additional elements may be disposed in or on the light-emitting unit 200 according to needs. The light-emitting unit 200 of the present disclosure is not limited to the structures as described above.

As described above, referring to FIG. 2, the subpixel 100 may include the light conversion layer 302 disposed on the light-emitting unit 200. The light conversion layer 302 may have the function of converting the wavelength of light. For example, the light source generated by the light-emitting unit 200 may be converted into the light having the wavelength of a particular range (the light having a particular color). In some embodiments, the light conversion layer 302 may include a matrix and particles dispersed in the matrix. In some embodiments, the material of the matrix may include, but is not limited to, an organic polymer, an inorganic polymer, glass, or a combination thereof. The matrix may be transparent or semi-transparent in accordance with some embodiments.

In some embodiments, the particles may include, but are not limited to, phosphors, quantum dot (QD) materials, organic fluorescent materials, or a combination thereof. In some embodiments, the light conversion layer 302 may include phosphors that can convert the light source into red light, green light, blue light or light having any other suitable color. In some embodiments, the quantum dot material may have a core-shell structure. The core structure may include, but is not limited to, CdSe, CdTe, CdS, ZnS, ZnSe, ZnO, ZnTe, InAs, InP, GaP, other suitable materials or a combination thereof. The shell structure may include, but is not limited to, ZnS, ZnSe, GaN, GaP, other suitable materials or a combination thereof.

In addition, in some embodiments, the light conversion layer 302 may include scatter particles. For example, the scatter particles may have a high reflection coefficient (e.g., greater than 30%). The scatter particles may further increase light absorption efficiency of the quantum dot material. In some embodiments, the material of the scatter particles may include titanium (Ti) or zinc (Zn). For example, in some embodiments, the scatter particles may include, but are not limited to, titanium dioxide ($TiO_2$), niobium-doped titanium oxide (TNO), zinc oxide (ZnO), zirconium dioxide ($ZrO_2$) or a combination thereof.

In some embodiments, the light conversion layer 302 may be formed by a chemical vapor deposition process, a coating process, a printing process, an inkjet printing process, other suitable processes, or a combination thereof. Moreover, the light conversion layer 302 may be formed by one or more photolithography processes and etching processes.

In addition, in some embodiments, the subpixel 100 may also include an adhesive layer 310 that is disposed between the light-emitting unit 200 and the light conversion layer 302, a first insulating layer 304 that is adjacent to the light-emitting unit 200, and a second insulating layer 306 that is adjacent to the light conversion layer 302. The detailed structures of the adhesive layer 310, the first insulating layer 304 and the second insulating layer 306 will be described in the following context.

Figure 4A:
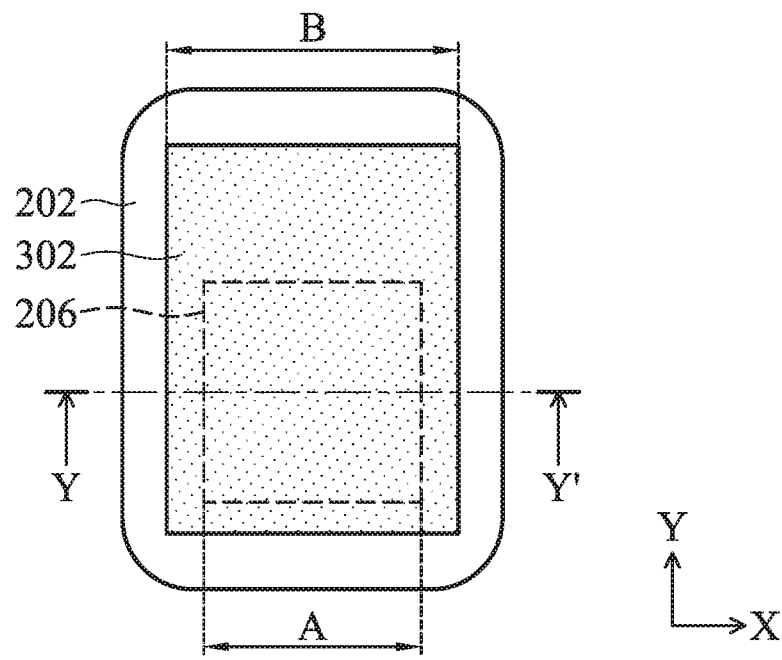
FIG. 4A illustrates a top-view diagram of the light-emitting unit and the light conversion layer in accordance with some embodiments of the present disclosure.
Figure 4B:
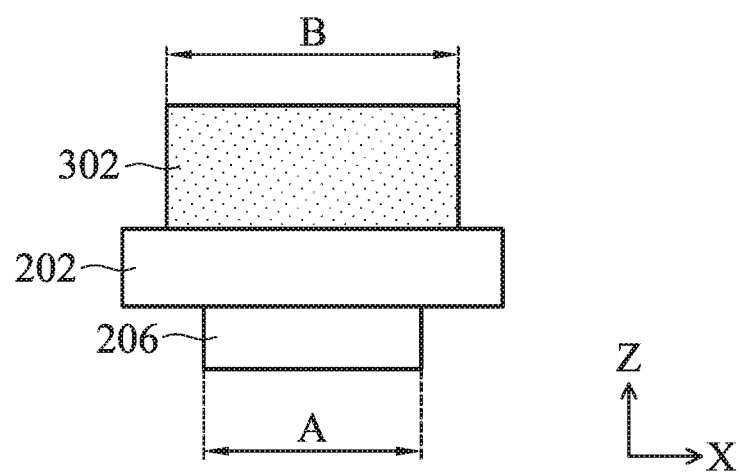
FIG. 4B illustrates a cross-sectional diagram along the line segment Y-Y' in FIG. 4A in accordance with some embodiments of the present disclosure.

Next, refer to FIGS. 4A and 4B. FIG. 4A illustrates a top-view diagram of the first semiconductor layer 202, the active layer 206 and the light conversion layer 302 in accordance with some embodiments of the present disclosure. FIG. 4B illustrates a cross-sectional diagram along the line segment Y-Y' in FIG. 4A.

As shown in FIGS. 4A and 4B, in a direction (for example, the X direction) that is perpendicular to the normal direction of the substrate 102a (for example, the Z direction) (illustrated in FIG. 2), the active layer 206 of the light-emitting unit 200 has a first length A and the light conversion layer 302 has a second length B. In accordance with some embodiments, the first length A of the active layer 206 and the second length B of the light conversion layer 302 may conform to the following formula: A+1 micrometers (μm) <B. In certain embodiments, the first length A may be less than or equal to 200 μm and greater than or equal to 1 μm, but it is not limited thereto. In certain embodiments, the second length B may be less than or equal to 600 μm, but it is not limited thereto.

It should be noted that if the first length A of the active layer 206 is too large (e.g., greater than the second length B), a part of the light of the light-emitting unit 200 may not be converted. In other words, the light conversion layer 302 having the second length B that is greater than the first length A may increase the percentage of light conversion of the light-emitting unit 200. Specifically, in one embodiment, when the second length B (or dimension) of the light conversion layer 302 is about 1.7 times the first length A (or dimension) of the active layer 206, light conversion efficiency can be improved by about 1.5 times. In some embodiments, the ratio (B/A) of the second length B of the light conversion layer 302 to the first length A of the active layer 206 may be in a range from about 1.1 to about 3, for example, 1.2, 1.7 or 2.

In addition, it should be understood that "the first length" and "the second length" as used herein are respectively defined as the length of a short side of a smallest rectangle that can encompass the active layer 206 and the length of a short side of a smallest rectangle that can encompass the light conversion layer 302. More specifically, the smallest rectangles that can encompass the regions of the active layer 206 and the light conversion layer 302 may be defined with a top-view angle of the first substrate 102a or the second substrate 102b. Alternatively, the smallest rectangles that can encompass the regions of the active layer 206 and the light conversion layer 302 may be defined with a plane (for example, the XY plane in the figure) that is substantially perpendicular to the normal direction of the first substrate 102a or the second substrate 102b (for example, the Z direction).

Specifically, in this embodiment, the active layer 206 and the light conversion layer 302 have a rectangular shape, and the first length A of the active layer 206 and the second length B of the light conversion layer 302 are respectively the length of the short side of the active layer 206 and the light conversion layer 302. If the rectangle is a square, either side of the rectangle can be regarded as a short side.

In some other embodiments, the shape of the active layer 206 and the light conversion layer 302 may be non-rectangular. FIGS. 5A-5E illustrate the top-view diagrams of the active layer 206 of the light-emitting unit 200 in accordance with some embodiments of the present disclosure. It should be understood that only the active layer 206 are shown in FIGS. 5A-5E to illustrate the definition of the first length A, and the light conversion layer 302 that is not shown in the figure can be defined in the same manner. As shown in FIGS. 5A-5E, in accordance with some embodiments, in a top-view angle of the first substrate 102a or the second substrate 102b, a light-emitting region of the active layer 206 may have a circular shape, an elliptical shape, a hexagonal shape, a ring shape, a triangle shape, an irregular shape, or any other suitable shape. In these embodiments, the first length A of the active layer 206 is the length of the short side of the smallest rectangle SQ that can encompass the active layer 206.

Figure 6A:
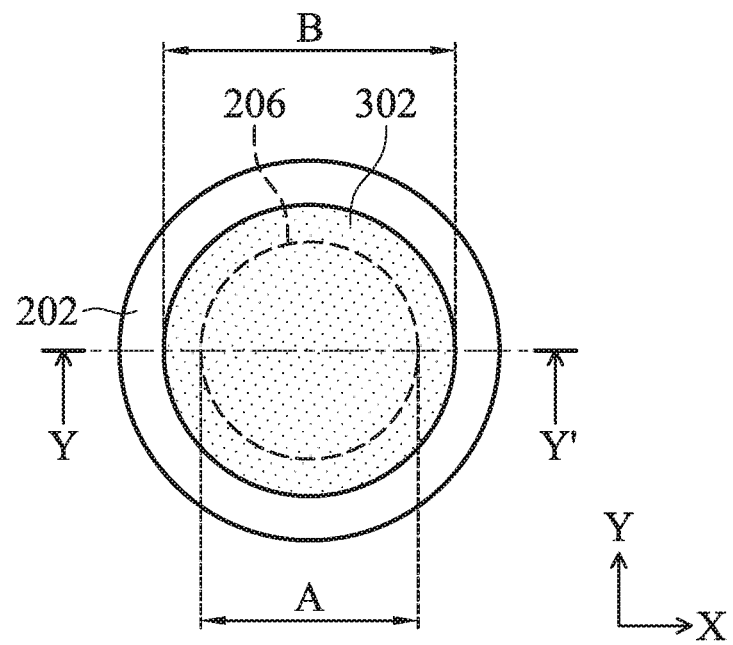
FIG. 6A illustrates a top-view diagram of the light-emitting unit and the light conversion layer in accordance with some embodiments of the present disclosure.
Figure 6B:
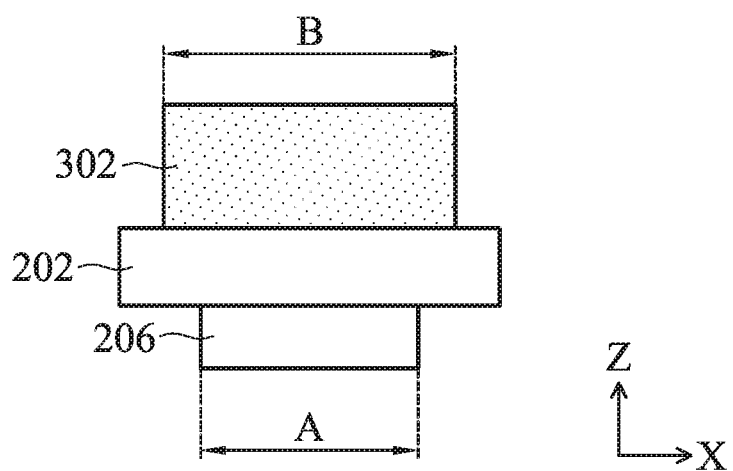
FIG. 6B illustrates a cross-sectional diagram of the light-emitting unit and the light conversion layer along the line segment Y-Y' in FIG. 6A in accordance with some embodiments of the present disclosure.

Refer to FIGS. 6A and 6B. FIG. 6A illustrates a top-view diagram of the first semiconductor layer 202, the active layer 206 and the light conversion layer 302 in accordance with some other embodiments of the present disclosure. FIG. 6B illustrates a cross-sectional diagram along the line segment Y-Y' in FIG. 6A. As shown in FIGS. 6A and 6B, in some embodiments, the light-emitting regions of the active layer 206 and the light conversion layer 302 may both have a circular shape. In this embodiment, the first length A of the active layer 206 and the second length B of the light conversion layer 302 also conform to the following formula: A+1 μm<B.

Figure 7A:
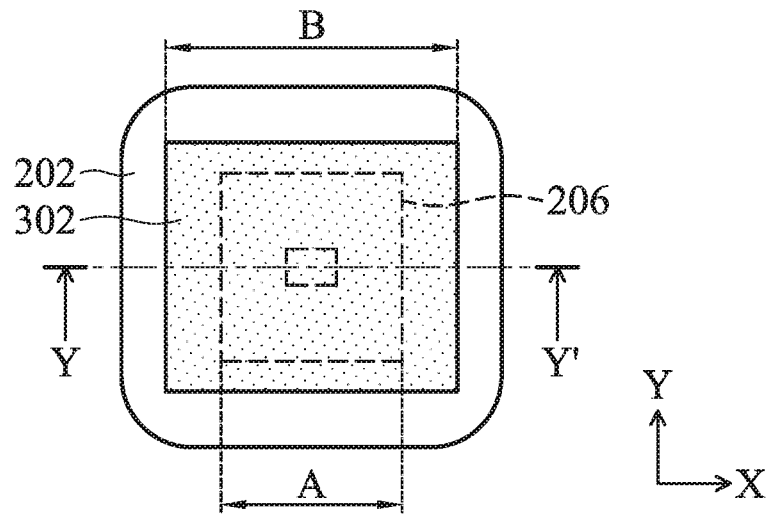
FIG. 7A illustrates a top-view diagram of the light-emitting unit and the light conversion layer in accordance with some embodiments of the present disclosure.
Figure 7B:
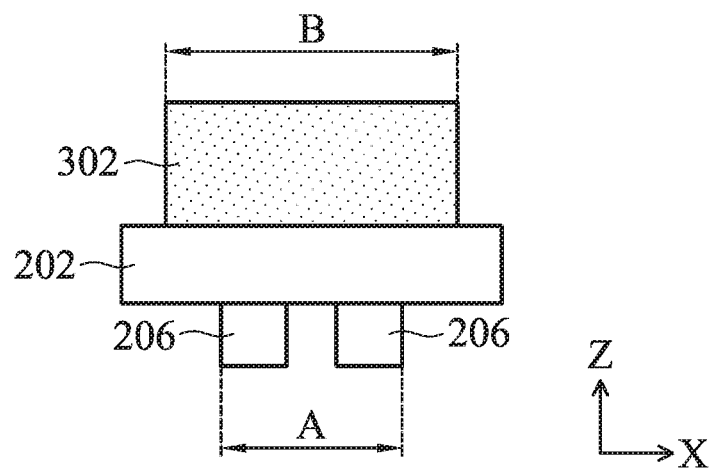
FIG. 7B illustrates a cross-sectional diagram of the light-emitting unit and the light conversion layer along the line segment Y-Y' in FIG. 7A in accordance with some embodiments of the present disclosure.

It should be understood that although the light-emitting region of the active layer 206 have the same or similar shape as the light conversion layer 302 in the embodiments as described above, the light-emitting region of the active layer 206 may have a different shape from the light conversion layer 302 in accordance with some other embodiments. For example, refer to FIGS. 7A and 7B. FIG. 7A illustrates a top-view diagram of the light-emitting unit 200 and the light conversion layer 302 in accordance with some other embodiments of the present disclosure. FIG. 7B illustrates a cross-sectional diagram along the line segment Y-Y' in FIG. 7A. In this embodiment, the shape of the light-emitting region of the active layer 206 may be a rectangle having a hollowed-out region, and the shape of the light conversion layer 302 may be a rectangle. In this embodiment, the first length A of the active layer 206 and the second length B of the light conversion layer 302 also conform to the following formula: A+1 μm<B.

Furthermore, in accordance with some embodiments, the second length B of the light conversion layer 302 and the pitch $S_p$ by which the subpixels 100 are spaced apart conform to the following formula: B<$S_p$−1 μm. In certain embodiments, the pitch $S_p$ may be less than or equal to 300 μm, but the present disclosure is not limited thereto.

It should be noted that if the pitch $S_p$ is too small (for example, less than the second length B), the subpixel 100 may be disturbed by a crosstalk effect, which may result in color mixing of the light sources. Therefore, the purity of the color of light source of the light-emitting unit 200 may be reduced.

Furthermore, in accordance with some embodiments, the first length A of the active layer 206 and the second length B of the light conversion layer 302 conform to the following formula: A+1 μm<B<$S_p$−1 μm.

Figure 8:
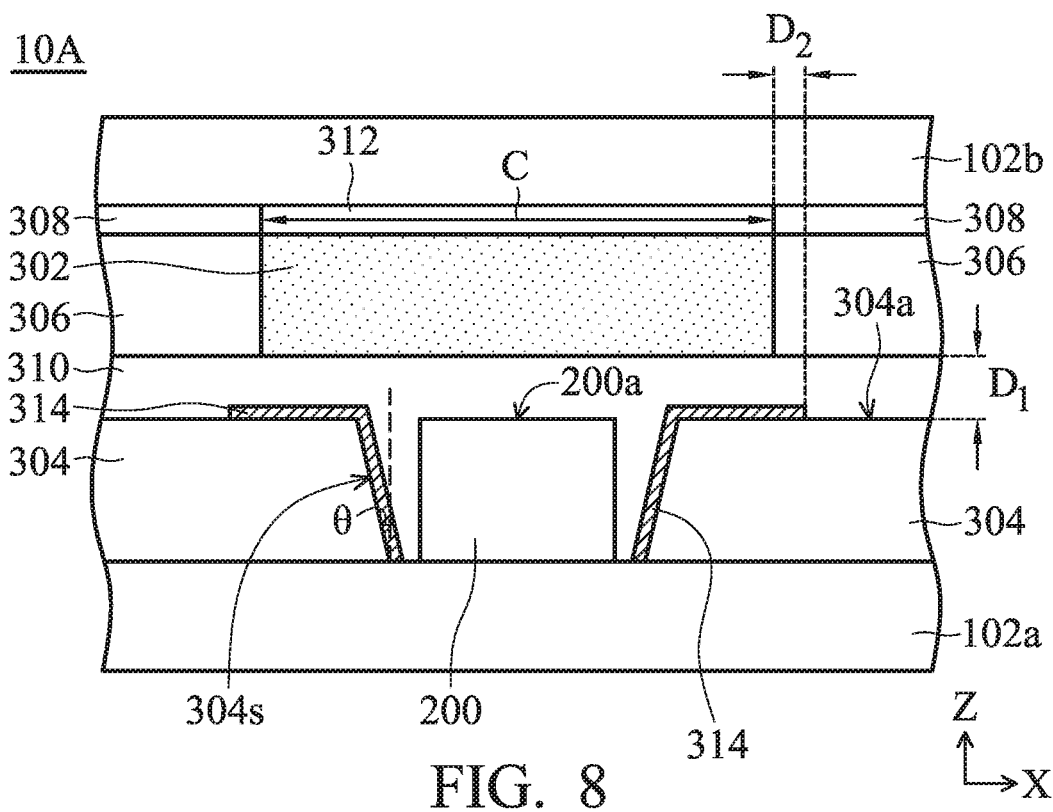
FIG. 8 illustrates a cross-sectional diagram of the display device in accordance with some embodiments of the present disclosure.

Next, refer to FIG. 8, which illustrates a cross-sectional diagram of a display device 10A in accordance with some embodiments of the present disclosure. It should be understood that the same or similar components or elements in above and below contexts are represented by the same or similar reference numerals. The materials, manufacturing methods and functions of these components or elements are the same or similar to those described above, and thus will not be repeated herein.

As shown in FIG. 8, the display device 10A may include the first substrate 102a, the second substrate 102b, the light-emitting unit 200 and the light conversion layer 302. The second substrate 102b may be disposed opposite to the first substrate 102a. The light-emitting unit 200 and the light conversion layer 302 may be disposed between the first substrate 102a and the second substrate 102b.

In addition, in some embodiments, the display device 10A may further include the first insulating layer 304 and the second insulating layer 306. The first insulating layer 304 and the second insulating layer 306 may be disposed between the first substrate 102a and the second substrate 102b. In some embodiments, the first insulating layer 304 may be disposed on the first substrate 102a and adjacent to the light-emitting unit 200, and the second insulating layer 306 may be disposed on the first insulating layer 304 and adjacent to the light conversion layer 302. The first insulating layer 304 and the second insulating layer 306 may serve as light shielding layers to reduce crosstalk effects or enhance the color gamut range. In some embodiments, light conversion layer 302 may substantially define an area of the subpixel of the display device 10A.

As shown in FIG. 8, in some embodiments, the first insulating layer 304 and the second insulating layer 306 may be spaced apart by a distance $D_1$. The distance $D_1$ may be the minimum distance between the first insulating layer 304 and the second insulating layer 306 along the normal direction of the first substrate 102a (for example, the Z direction) in a cross section. In some other embodiments, the light-emitting unit 200 and the light conversion layer 302 also may be spaced apart by the distance $D_1$. In some embodiments, the distance $D_1$ may be greater than or equal to 0.1 μm and less than or equal to 10 μm, for example, 2 μm, 5 μm, or 7 μm.

It should be noted that if the distance $D_1$ is too small (for example, less than 0.1 μm), the adhesive layer 310 disposed between the first insulating layer 304 and the second insulating layer 306 may not be able to efficiently fix the structure. Conversely, if the distance $D_1$ is too large (for example, greater than 10 μm), light conversion efficiency of the light-emitting unit 200 may be decreased. Specifically, for the above embodiments in which the second length B of the light conversion layer 302 is about 1.7 times the first length A of the active layer 206, when the distance $D_1$ is decreased from 3 μm to 1 μm, light conversion efficiency can be increased by about 1.2 times.

Furthermore, in some embodiments, the first insulating layer 304 may be not in contact with the light-emitting unit 200. In some other embodiments, the first insulating layer 304 may be in contact with the light-emitting unit 200, for example, a sidewall 304s of the first insulating layer 304 may be in contact with the light-emitting unit 200. In some embodiments, the sidewall 304s of the first insulating layer 304 that is adjacent to the light-emitting unit 200 and the normal direction of the first substrate 102a (e.g., the Z direction) may include an included angle θ therebetween. For example, the included angle θ may be in a range from about 0 degree to about 45 degrees, such as about 15 degrees, about 30 degrees, or about 40 degrees.

In some embodiments, the first insulating layer 304 and the second insulating layer 306 may include an insulating material. In some embodiments, the first insulating layer 304 and/or the second insulating layer 306 may include a material having a light shielding property. For example, the first insulating layer 304 and the second insulating layer 306 may include a material having high reflectivity (e.g., greater than 30%) or low reflectivity (e.g., less than 30%). In some embodiments, the material of the first insulating layer 304 and/or the second insulating layer 306 may include a black photoresist or a white photoresist. In some embodiments, the materials of the first insulating layer 304 and the second insulating layer 306 may include, but is not limited to, an organic resin, a glass paste, other suitable materials, or a combination thereof.

In some embodiments, the materials of the first insulating layer 304 and the second insulating layer 306 may further include a reflective material. For example, in some embodiments, the first insulating layer 304 and the second insulating layer 306 may further include metal particles (e.g., nickel, aluminum, molybdenum, and alloys thereof), metal oxide particles (e.g., chromium oxide or titanium dioxide), metal nitride particles (e.g., chromium nitride), graphite particles, or a combination thereof, but they are not limited thereto. In addition, the first insulating layer 304 and the second insulating layer 306 may be formed of the same material or different materials. In some embodiments, the material of the first insulating layer 304 may include black photoresists, and the material of the second insulating layer 306 may include white photoresists.

In some embodiments, the first insulating layer 304 and the second insulating layer 306 may be formed by a chemical vapor deposition process, a coating process, a printing process, an inkjet printing process, other suitable processes, or a combination thereof. Furthermore, the first insulating layer 304 and the second insulating layer 306 may be formed by one or more photolithography processes and etching processes.

Moreover, in some embodiments, the display device 10A may further include a third insulating layer 308 disposed between the second insulating layer 306 and the second substrate 102b. The material of the third insulating layer 308 may be similar to the materials of the first insulating layer 304 and second insulating layer 306 as described above. In some embodiments where the material of the second insulating layer 306 includes white photoresists, the material of the third insulating layer 308 may include black photoresists.

In addition, in some embodiments, the display device 10A may further include the adhesive layer 310 disposed between the first insulating layer 304 and the second insulating layer 306. In some embodiments, the adhesive layer 310 may be in contact with the light conversion layer 302, the first insulating layer 304, and the second insulating layer 306, and the second substrate 102b may be fixed on the first substrate 102a. As shown in FIG. 8, in some embodiments, the adhesive layer 310 may be disposed between the first insulating layer 304 and the light-emitting unit 200. In some other embodiments, the light-emitting unit 200 may be partially disposed in the first insulating layer 304 with only a top surface 200a in contact with the adhesive layer 310, but it is not limited thereto. Alternatively, in some other embodiments, the light-emitting unit 200 may be entirely disposed in the first insulating layer 304 without being in contact with the adhesive layer 310.

The adhesive layer 310 may include an adhesive material. In some embodiments, the adhesive layer 310 may include, but is not limited to, an optical clear adhesive (OCA), an optical clear resin (OCR), other suitable adhesive materials, or a combination of the thereof. In some embodiments, the adhesive layer 310 may be transparent or semi-transparent.

In some embodiments, the adhesive layer 310 may be formed by a chemical vapor deposition process, a coating process, a printing process, an inkjet printing process, other suitable processes, or a combination thereof.

Furthermore, in some embodiments, the display device 10A may further include a filter layer 312 disposed on the light conversion layer 302. The filter layer 312 may filter or adjust the optical properties of the light that passes through the light conversion layer 302. In some embodiments, the filter layer 312 may include, but is not limited to, a red-light filter layer, a green-light filter layer, a blue-light filter layer, other filter layers having suitable colors or performances, or a combination thereof. In some embodiments, the filter layer 312 and the light conversion layer 302 may have substantially the same or similar dimensions, that is, in a cross section, in a direction (for example, the X direction) that is perpendicular to the normal direction of the first substrate 102a (for example, the Z direction), a third length C of the filter layer 312 and the first length A of the active layer 206 may conform to the following formula: $A+1\ \mu m < C < S_p - 1\ \mu m$. In some other embodiments, the third length C of the filter layer 312 may be greater than or equal to the second length B of the light conversion layer 302.

In addition, in some embodiments, the display device 10A may further include a first reflective layer 314 disposed on a portion of the first insulating layer 304. As shown in FIG. 8, in some embodiments, a portion of the first reflective layer 314 may be disposed between the light-emitting unit 200 and the first insulating layer 304, a portion of the first reflective layer 314 may be disposed between the light conversion layer 302 and the first insulating layer 304, and a portion of the first insulating layer 304 may be disposed between the second insulating layer 306 and the first insulating layer 304. The first reflective layer 314 may reflect the light emitted by the light-emitting unit 200 to the light conversion layer 302 to increase light conversion efficiency of the light-emitting unit 200.

As described above, a portion of the first reflective layer 314 may be disposed between the second insulating layer 306 and the first insulating layer 304. That is, the first reflective layer 314 and the second insulating layer 306 may at least partially overlap. Specifically, the first reflective layer 314 and the second insulating layer 306 may at least partially overlap in the normal direction of the first substrate 102a or the second substrate 102b. In some embodiments, in a cross section, the first reflective layer 314 and the second insulating layer 306 may overlap each other with a distance $D_2$ in a range of at least 1 μm (greater than or equal to 1 μm), for example, 2 μm to 100 μm, or 10 μm to 50 μm, but the present disclosure is not limited thereto. It should be understood that if the distance $D_2$ is too large, for example, greater than a half of the pitch ($S_p/2$), the light reflected by the first reflective layer 314 may affect other adjacent subpixels, which may result in the mixing of light.

The first reflective layer 314 may include a material having reflective properties. In some embodiments, the material of the first reflective layer 314 may include a metal. For example, the metal may include, but is not limited to, copper (Cu), aluminum (Al), indium (In), ruthenium (Ru), tin (Sn), gold (Au), platinum (Pt), zinc (Zn), silver (Ag), titanium (Ti), lead (Pb), nickel (Ni), chromium (Cr), magnesium (Mg), palladium (Pd), copper alloy, aluminum alloy, indium alloy, ruthenium alloy, tin alloy, gold alloy, platinum alloy, zinc alloy, silver alloy, titanium alloy, lead alloy, nickel alloy, chromium alloy, magnesium alloy, palladium alloy, other suitable materials or a combination thereof. In some other embodiments, the material of the first reflective layer 314 may further include titanium dioxide, silicon dioxide or a combination thereof.

In some embodiments, the first reflective layer 314 may be formed by the above deposition process, coating process, printing process, inkjet printing process, other suitable processes, or a combination thereof. Furthermore, the first reflective layer 314 may be formed by one or more photolithography processes and etching processes.

Figure 9:
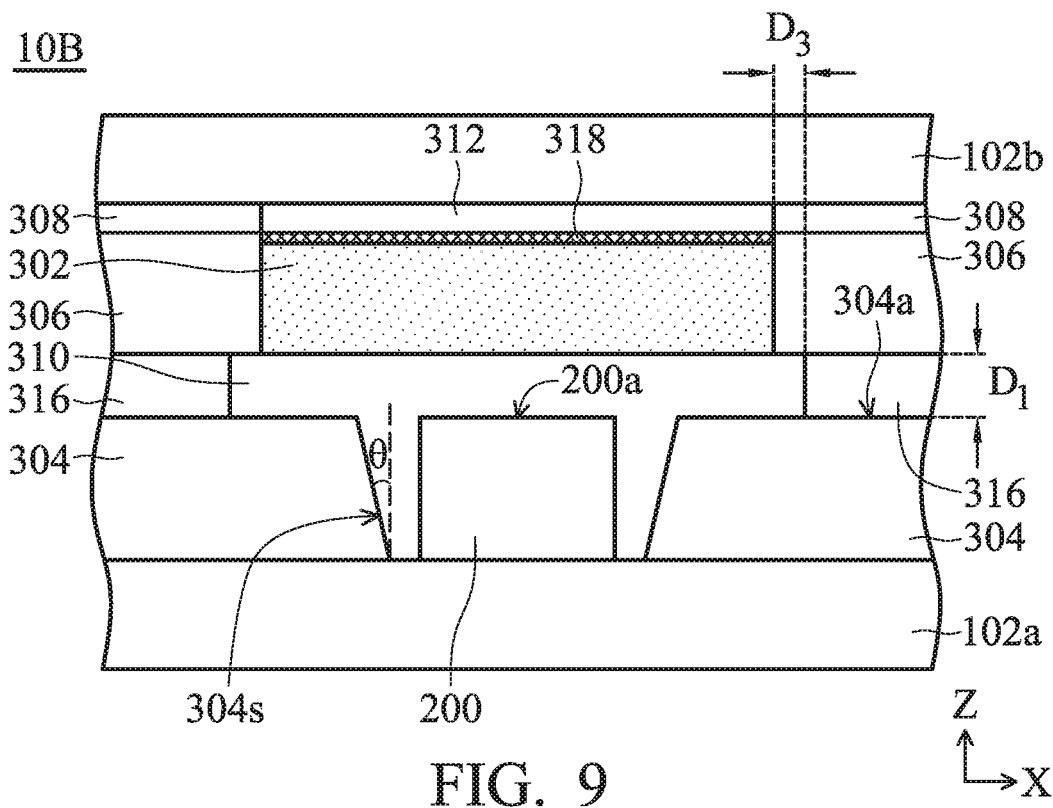
FIG. 9 illustrates a cross-sectional diagram of the display device in accordance with some embodiments of the present disclosure.

Next, refer to FIG. 9, which illustrates a cross-sectional diagram of a display device 10B in accordance with some other embodiments of the present disclosure. The display device 10B is substantially similar to the display device 10A shown in FIG. 8. The difference between them is that, the display device 10B may further include a first spacer layer 316 disposed between the first insulating layer 304 and the second insulating layer 306 in the embodiment shown in FIG. 9. In some embodiments, the display device 10B may further include a second spacer layer 318 disposed between the light conversion layer 302 and the filter layer 312. In some embodiments, the material of the second spacer layer 318 may include, but is not limited to, material having a low refraction coefficient, and the refraction coefficient may, for example, be between 1 and 1.5, but the present disclosure is not limited thereto.

The first spacer layer 316 may include a material having low reflectivity (e.g., less than 30%) or low light transmittance (e.g., less than 10%). In some embodiments, the material of the first spacer layer 316 may include black photoresists. In some embodiments, the first spacer layer 316 may include, but is not limited to, an organic resin, a glass paste, other suitable materials, or a combination thereof. In some embodiments, the first spacer layer 316 may further include, but is not limited to, metal oxide particles (e.g., chromium oxide or titanium dioxide), metal nitride particles (e.g., chromium nitride), graphite particles, or a combination thereof.

Specifically, in this embodiment, the material of the first insulating layer 304 may be formed of a material having high reflectivity (for example, greater than 30%). For example, a material having high reflectivity may include white photoresists. As described above, the first spacer layer 316 may be formed of a material having low light transmittance, and therefore, the influence of the light reflected by the first insulating layer 304 on adjacent subpixels may be reduced, or mutual interference between the subpixels may be reduced. Furthermore, in this embodiment, since the first insulating layer 304 may be formed of a material having high reflectivity, the first reflective layer 314 may not be additionally disposed on the first insulating layer 304. In some other embodiments, the first insulating layer 304 may be in contact with the light-emitting unit 200.

In some embodiments, in a cross section, in a direction perpendicular to the normal direction of the first substrate 102a or the second substrate 102b, the first spacer layer 316 and the light conversion layer 302 may be spaced apart by a minimum distance $D_3$. In some embodiments, the range of the distance $D_3$ may be greater than or equal to 1 μm, for example, from about 1 μm to about 200 μm, or from about 50 μm to about 100 μm, but the present disclosure is not limited thereto.

Furthermore, the second spacer layer 318 may be formed of a material having a low refraction coefficient, for example, the refractive coefficient may be less than 1.5. In some embodiments, the material of the second spacer layer 318 may include, but is not limited to, an organic resin, a glass paste, a siloxane polymer, other suitable materials, or a combination thereof. In some embodiments, the material of the second spacer layer 318 may further include a silicon oxide compound, a resin, an air gap, or a combination thereof. For example, the second spacer layer 318 may include the silicon oxide compound and the air gap. The second spacer layer 318 may also include the resin and the air gap. In some embodiments, the second spacer layer 318 may be transparent or semi-transparent.

Figure 10:
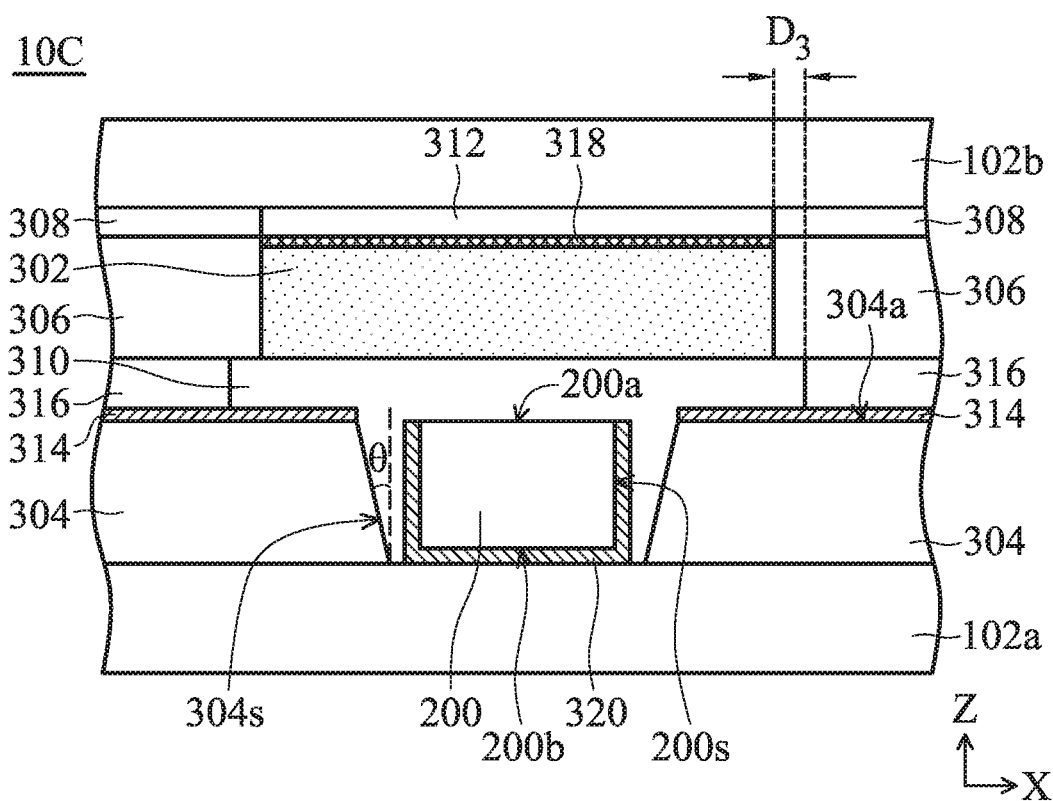
FIG. 10 illustrates a cross-sectional diagram of the display device in accordance with some embodiments of the present disclosure.

Next, refer to FIG. 10, which illustrates a cross-sectional diagram of a display device 10C in accordance with some other embodiments of the present disclosure. The display device 10C is substantially similar to the display device 10B shown in FIG. 9. The difference between them is that, the display device 10C may further include a second reflective layer 320 disposed on a sidewall 200s of the light-emitting unit 200 in the embodiment shown in FIG. 10. In some embodiments, the second reflective layer 320 may also be disposed on a bottom surface 200b of the light-emitting unit 200. In some embodiments, the second reflective layer 320 may be in contact with the sidewall 200s and the bottom surface 200b of the light-emitting unit 200. In addition, the second reflective layer 320 may expose the contact structure (e.g., the first electrode layer 208 and the second electrode layer 210) of the light-emitting unit 200 for electrical connection.

The second reflective layer 320 may reduce the light emitted by the light-emitting unit 200 from being absorbed by the first insulating layer 304, and thereby the light-emitting efficiency of the light-emitting unit 200 may be improved. In some embodiments, the second reflective layer 320 may include an omni-directional reflector (ODR) structure, a distributed Bragg reflector (DBR) structure, or a combination thereof. In particular, the omni-directional reflector structure may include a stack of dielectric material/metal reflective material/dielectric material, and the Bragg reflector structure may include a stack of a plurality of dielectric materials having different refraction coefficients. In some embodiments, the dielectric material may include, but is not limited to, silicon oxide ($SiO_x$), silicon nitride (SiNx), silicon oxynitride (SiON), aluminum oxide ($Al_2O_3$), titanium dioxide ($TiO_2$), other suitable materials, or combination thereof. In some embodiments, the metal reflective material may include, but is not limited to, copper, aluminum, indium, ruthenium, tin, gold, platinum, zinc, silver, titanium, lead, nickel, chromium, magnesium, palladium, copper alloy, aluminum alloy, indium alloy, ruthenium alloy, tin alloy, gold alloy, platinum alloy, zinc alloy, silver alloy, titanium alloy, lead alloy, nickel alloy, chromium alloy, magnesium alloy, palladium alloy, other suitable materials or a combination thereof.

In some embodiments, the second reflective layer 320 may be formed by the above deposition process, coating process, printing process, inkjet printing process, other suitable processes, or a combination thereof. Furthermore, the second reflective layer 320 may be formed by one or more photolithography processes and etching processes.

In addition, in this embodiment, at least a portion of the first reflective layer 314 may be disposed on a top surface 304a of the first insulating layer 304 and extend between the first spacer layer 316 and the first insulating layer 304. In this embodiment, since the second reflective layer 320 is disposed on the light-emitting unit 200, the first reflective layer 314 that is disposed on the sidewall 304s of the first insulating layer 304 may be optionally omitted. Moreover, in this embodiment, the material of the first insulating layer 304 may include a material having low light transmittance, for example, may include black photoresists, but it is not limited thereto.

To summarize the above, in accordance with some embodiments of the present disclosure, the subpixel of the display device may include the active layer and the light conversion layer having a specific dimensional relationship. In addition, in accordance with some embodiments of the present disclosure, the distance between the light-emitting unit and the light conversion layer may be in a specific range. With the specific configuration of the subpixel structure as described above, light conversion efficiency of the display device may be improved, or crosstalk between subpixels may be reduced.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A display device, comprising:
   a first substrate;
   a first subpixel disposed on the first substrate; and
   a second subpixel disposed adjacent to the first subpixel and spaced apart from each other by a pitch, and at least one of the first subpixel and the second subpixel comprises:
   a light-emitting unit comprising an active layer, the active layer having a first length along a direction that is perpendicular to a normal direction of the first substrate; and
   a light conversion layer disposed on the light-emitting unit, the light conversion layer having a second length along the direction that is perpendicular to the normal direction of the first substrate;
   wherein the first length (denoted as A), the second length (denoted as B) and the pitch (denoted as $S_p$) conform to the following formula:

$A+1$ micrometers$<B<S_p-1$ micrometers.

2. The display device as claimed in claim 1, further comprising:
   a first insulating layer disposed adjacent to the light-emitting unit; and
   a second insulating layer disposed on the first insulating layer;
   wherein a distance between the first insulating layer and the second insulating layer is greater than or equal to 0.1 micrometers and less than or equal to 10 micrometers.

3. The display device as claimed in claim 2, further comprising an adhesive layer disposed between the first insulating layer and the second insulating layer.

4. The display device as claimed in claim 2, further comprising a first reflective layer disposed on a portion of the first insulating layer.

5. The display device as claimed in claim 4, wherein at least a portion of the first reflective layer is disposed on a top surface of the first insulating layer and between the first insulating layer and the second insulating layer.

6. The display device as claimed in claim 4, wherein the first reflective layer and the second insulating layer at least partially overlap each other.

7. The display device as claimed in claim 6, wherein the first reflective layer and the second insulating layer overlap each other with a distance greater than or equal to 1 micrometer.

8. The display device as claimed in claim 4, further comprising a first spacer layer disposed between the first insulating layer and the second insulating layer.

9. The display device as claimed in claim 8, wherein the first spacer layer and the light conversion layer are spaced apart by a distance greater than or equal to 1 micrometer.

10. The display device as claimed in claim 8, wherein the first reflective layer is disposed on a top surface of the first insulating layer and extends between the first spacer layer and the first insulating layer.

11. The display device as claimed in claim 2, wherein a material of the first insulating layer comprises a reflective material.

12. The display device as claimed in claim 1, further comprising a filter layer disposed on the light conversion layer.

13. The display device as claimed in claim 12, further comprising a second spacer layer disposed between the light conversion layer and the filter layer.

14. The display device as claimed in claim 12, wherein the filter layer has a third length along the direction that is perpendicular to the normal direction of the first substrate, and the third length (denoted as C), the first length (denoted as A) and the pitch (denoted as $S_p$) conform to the following formula:

$A+1$ micrometers$<C<S_p-1$ micrometers.

15. The display device as claimed in claim 1, further comprising a second reflective layer disposed on a sidewall of the light-emitting unit.

16. The display device as claimed in claim 15, wherein the second reflective layer is further disposed on a bottom surface of the light-emitting unit.

17. The display device as claimed in claim 15, wherein the second reflective layer comprises an omni-directional reflector (ODR) structure, a distributed Bragg reflector (DBR) structure, or a combination thereof.

18. The display device as claimed in claim 1, wherein a ratio of the second length of the light conversion layer to the first length of the active layer is in a range from 1.1 to 3.

19. The display device as claimed in claim 1, wherein the first length is less than or equal to 200 micrometers and greater than or equal to 1 micrometer.

20. The display device as claimed in claim 1, wherein the second length is less than or equal to 600 micrometers.

* * * * *